United States Patent
Tsubouchi

(10) Patent No.: US 6,566,974 B2
(45) Date of Patent: May 20, 2003

(54) CONNECTION STRUCTURE FOR NOISE REDUCTION IMPEDANCE ELEMENT, NOISE REDUCTION IMPEDANCE ELEMENT POSITIONING METHOD, AND RECORDING MEDIUM HAVING NOISE REDUCTION IMPEDANCE ELEMENT POSITIONING PROGRAM RECORDED THEREIN

(75) Inventor: Toshiro Tsubouchi, Kanagawa-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/954,609

(22) Filed: Sep. 17, 2001

(65) Prior Publication Data

US 2002/0050871 A1 May 2, 2002

(30) Foreign Application Priority Data

Sep. 26, 2000 (JP) ........................................ 2000-292554

(51) Int. Cl.$^7$ ................................................. H01P 5/00
(52) U.S. Cl. ......................... 333/12; 333/24 R; 333/25; 333/1; 333/22 R
(58) Field of Search ............................ 333/12, 1, 24 C, 333/25, 33, 22 R, 132, 133, 202, 17.2, 116, 201, 172, 14, 207

(56) References Cited

U.S. PATENT DOCUMENTS

| | | | | | |
|---|---|---|---|---|---|
| 5,095,291 A | * | 3/1992 | Staschover et al. | ............ | 333/12 |
| 5,587,692 A | * | 12/1996 | Graham et al. | ................ | 333/12 |
| 5,633,614 A | * | 5/1997 | Decramer | ..................... | 333/25 |
| 5,717,359 A | * | 2/1998 | Matsui et al. | .................. | 333/12 |
| 5,852,613 A | * | 12/1998 | Nagatani et al. | ............... | 333/12 |
| 5,923,225 A | * | 7/1999 | De Los Santos | .............. | 333/12 |
| 6,057,743 A | * | 5/2000 | Aekins | ........................... | 333/1 |
| 6,097,262 A | * | 8/2000 | Combellack | ................. | 333/12 |

* cited by examiner

Primary Examiner—Michael Tokar
Assistant Examiner—Lam T. Mai
(74) Attorney, Agent, or Firm—Keating & Bennett, LLP

(57) ABSTRACT

A noise reduction impedance element connection structure includes first and second noise-reduction impedance elements which are electrically connected to a transmission path. A noise frequency that exceeds a predetermined limit when the first noise-reduction impedance element is connected is measured or calculated by simulation to find the current peak. The second noise-reduction impedance element is connected at a location corresponding to the current peak. Therefore, this structure provides high noise suppression performance.

14 Claims, 6 Drawing Sheets

CONNECTION STRUCTURE FOR NOISE
REDUCTION IMPEDANCE ELEMENT,
NOISE REDUCTION IMPEDANCE
ELEMENT POSITIONING METHOD, AND
RECORDING MEDIUM HAVING NOISE
REDUCTION IMPEDANCE ELEMENT
POSITIONING PROGRAM RECORDED
THEREIN

BACKGROUND OF THE INVENTION

1. Field of the Invention

The present invention relates to a connection structure for a noise reduction impedance element, a noise reduction impedance element positioning method, and a recording medium having a noise reduction impedance element positioning program recorded therein.

2. Description of the Related Art

Faster electronic circuits produce stronger radiated noise, leading to demands for more effective noise reduction. Typically, resistors, inductors, capacitors, and the like are employed to achieve noise reduction. When a single component does not provide sufficient noise reduction, composite components, such as a combination of an inductor and a capacitor, are used.

In general, noise reduction components are connected at a transmission side of an electronic device (noise source). This is because a noise reduction component which is electrically connected to a transmission side is said to provide higher noise suppression performance. Sometimes, electronic devices (noise sources) are connected to both ends of a signal cable so that an RF signal is transmitted/received via the signal cable. In this case, noise reduction components may be connected in the vicinity of cable connectors located at both ends of the signal cable.

Recently, the demand for low power consumption electronic circuits has increased, and impedance elements such as resistors or inductors, which do not include capacitors which causes a relatively high power consumption, tend to be used as noise reduction components to achieve noise reduction. However, if impedance elements such as resistors or inductors only are used, there is a noise frequency which is not attenuated unless the impedance of the impedance elements increases. However, increased impedance leads to a problem in that an RF signal waveform is increasingly distorted, leading to incorrect operation.

SUMMARY OF THE INVENTION

It is an object of the present invention to provide a connection structure for a noise reduction impedance element, a noise reduction impedance element positioning method, and a recording medium having a noise reduction impedance element positioning program recorded therein, thereby providing high noise reduction performance.

To this end, in one aspect of the present invention, a noise reduction impedance element connection structure includes a transmission path for providing an electrical connection between a first electrical element, such as a signal output IC, and a second electrical element, such as a load IC. A first noise-reduction impedance element electrically connected to the transmission path at a first location thereon, such as the signal output IC of the transmission path, and a second noise-reduction impedance element is electrically connected to the transmission path at a second location thereon, such as the load IC of the transmission path. The first location corresponds to the current peak of a noise frequency that exceeds a predetermined limit when the first noise-reduction impedance element is electrically connected to the transmission path. The noise reduction impedance elements maybe impedance elements, such as resistors, inductors, or common mode choke coils, but do not include capacitors.

In another aspect of the present invention, a noise reduction impedance element positioning method includes the steps of: (a) electrically connecting a first noise-reduction impedance element to a signal output IC of the transmission path, the transmission path providing an electrical connection between the first electrical element, such as the signal output IC, and a second electrical element, such as a load IC; (b) determining whether or not a numerical value obtained by one of a measurement and a calculation using simulation with respect to a noise frequency satisfies a predetermined limit; (c) identifying a noise frequency in excess of the predetermined limit; (d) determining a location corresponding to the current peak of the noise frequency in excess of the predetermined limit by one of the measurement and the calculation using simulation; and (e) electrically connecting a second noise-reduction impedance element at the location corresponding to the current peak.

In still another aspect of the present invention, a recording medium contains a program implementing a noise reduction impedance element positioning process by a computer, the process including the steps of: entering the name of a first noise-reduction impedance element and the name of a second noise-reduction impedance element, the first noise-reduction impedance element being electrically connected to a transmission path at a first location thereon, such as to a signal output IC on the transmission path, the second noise-reduction impedance element being electrically connected to a second electrical element, such as a load IC on the transmission path, the transmission path providing an electrical connection between the first and second elements; determining a location corresponding to the current peak of a noise frequency that exceeds a predetermined limit when the first noise-reduction impedance element is electrically connected to the transmission path; determining a noise characteristic of the transmission path to which the first and second noise-reduction impedance elements are connected, the second noise-reduction impedance element being connected at the location corresponding to the current peak; and determining whether or not the noise characteristic satisfies the predetermined limit.

Accordingly, first, a first noise-reduction impedance element is electrically connected to a transmission path. A noise frequency that exceeds a predetermined limit when the first noise-reduction impedance element is connected is measured or calculated by simulation to find the current peak. Further, a second noise-reduction impedance element is electrically connected to the transmission path at a location corresponding to the current peak. Therefore, radiated noise on the transmission path can be effectively reduced without using a capacitor.

Other features and advantages of the present invention will become apparent from the following description of the invention which refers to the accompanying drawings.

BRIEF DESCRIPTION OF THE DRAWING(S)

Figure 7:
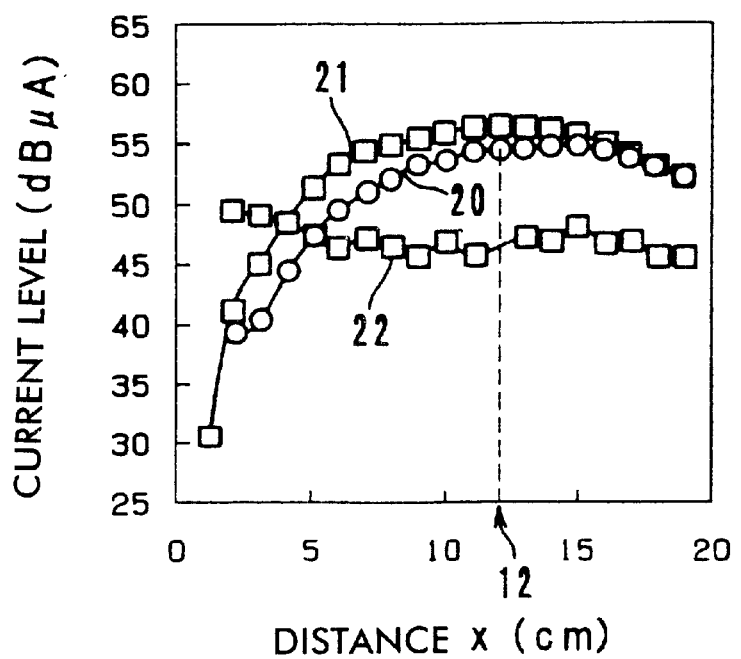
Figure 8:
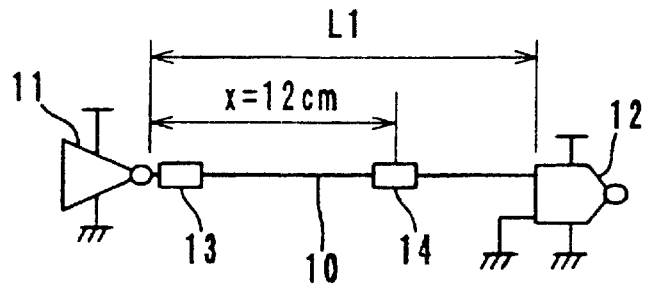
Figure 9:
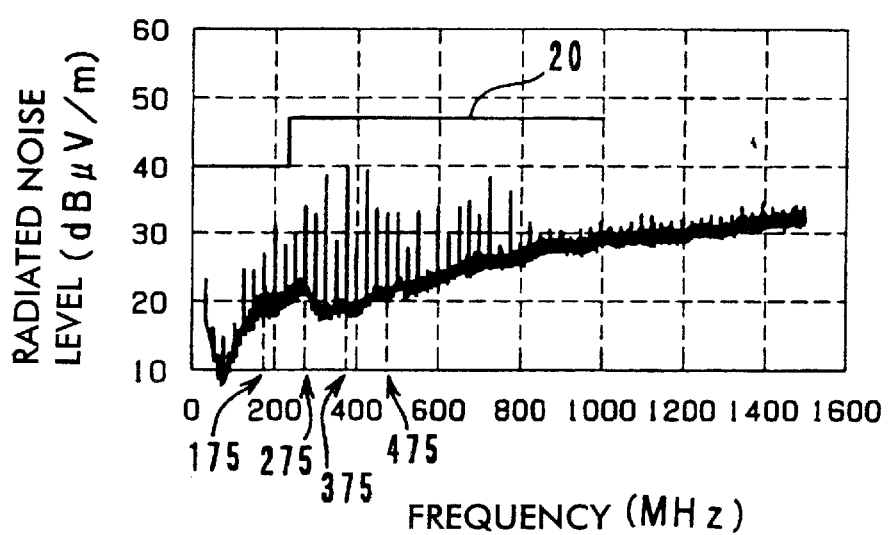
Figure 12:
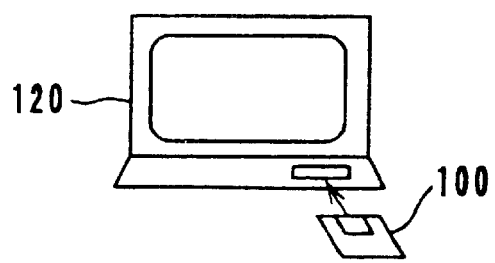
Figure 10:
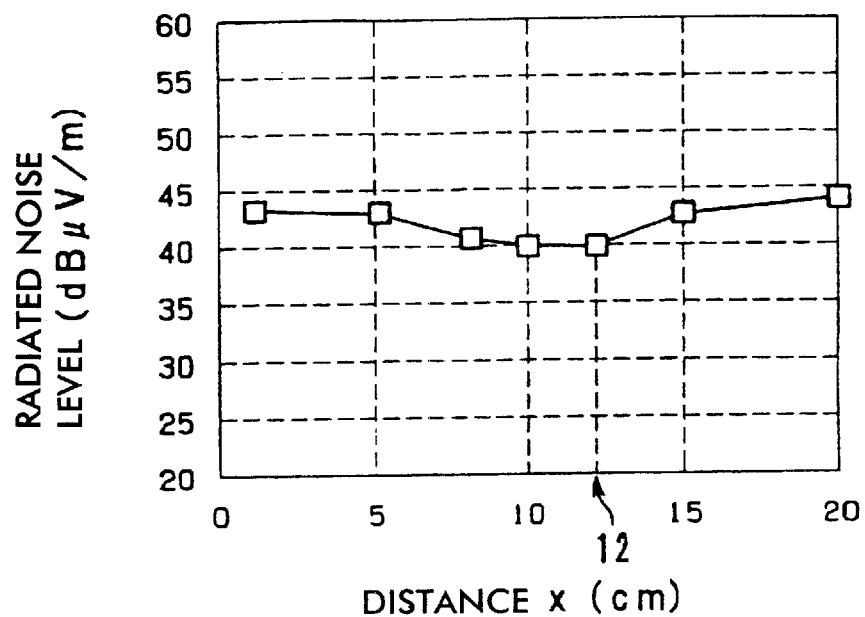
Figure 11:
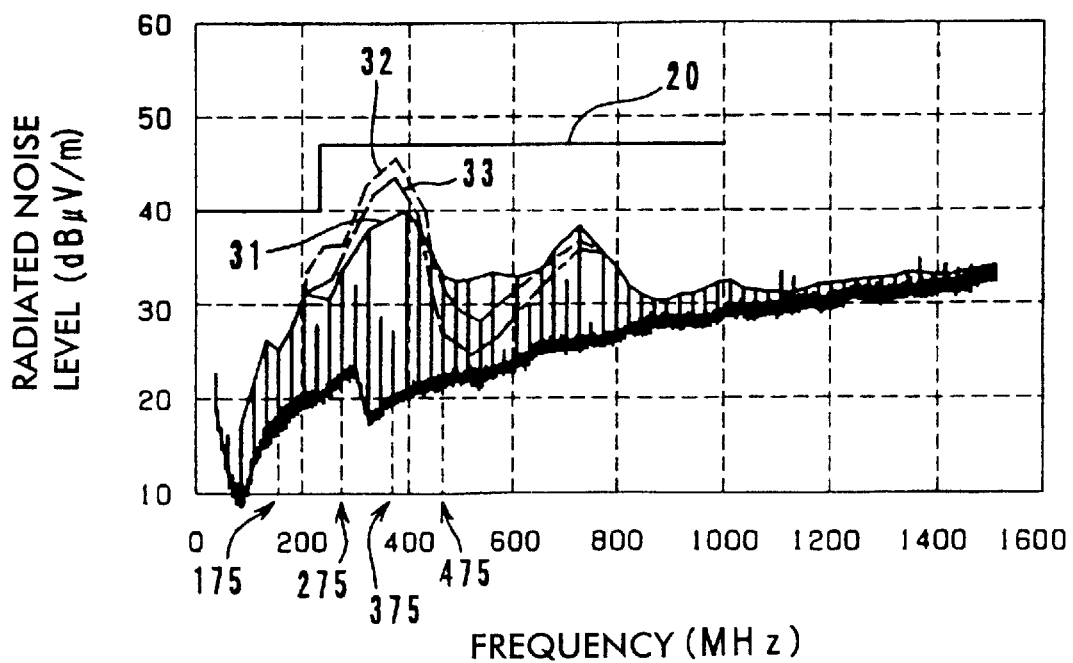

FIG. 7 is a current distribution chart when a current having a frequency of 375 MHZ flows in the transmission path, where a solid line 20 indicates the current distribution when the first noise-reduction impedance element is connected, a solid line 21 indicates the current distribution in the initial state where there is no noise reduction impedance element connected, and a solid line 22 indicates the current distribution when first and second noise-reduction impedance elements are connected;

FIG. 8 is a schematic view of a transmission path to which the first and second noise-reduction impedance elements are connected;

FIG. 9 is a graph showing the radiated noise characteristic of the transmission path shown in FIG. 9;

FIG. 10 is a graph showing the relationship between the noise suppressing performance of the noise frequency of 375 MHZ by the second noise-reduction impedance element, and the location at which it is connected;

FIG. 11 is a graph showing the radiated noise suppressing performance by the first and second noise-reduction impedance elements; and FIG. 12 is a schematic view of a recording medium having a noise reduction impedance element positioning program recorded therein according to the present invention.

DETAILED DESCRIPTION OF THE PREFERRED EMBODIMENTS

The present invention will be apparent to those skilled in the art from the following detailed description of embodiments with reference to the accompanying drawings.

Figure 1:
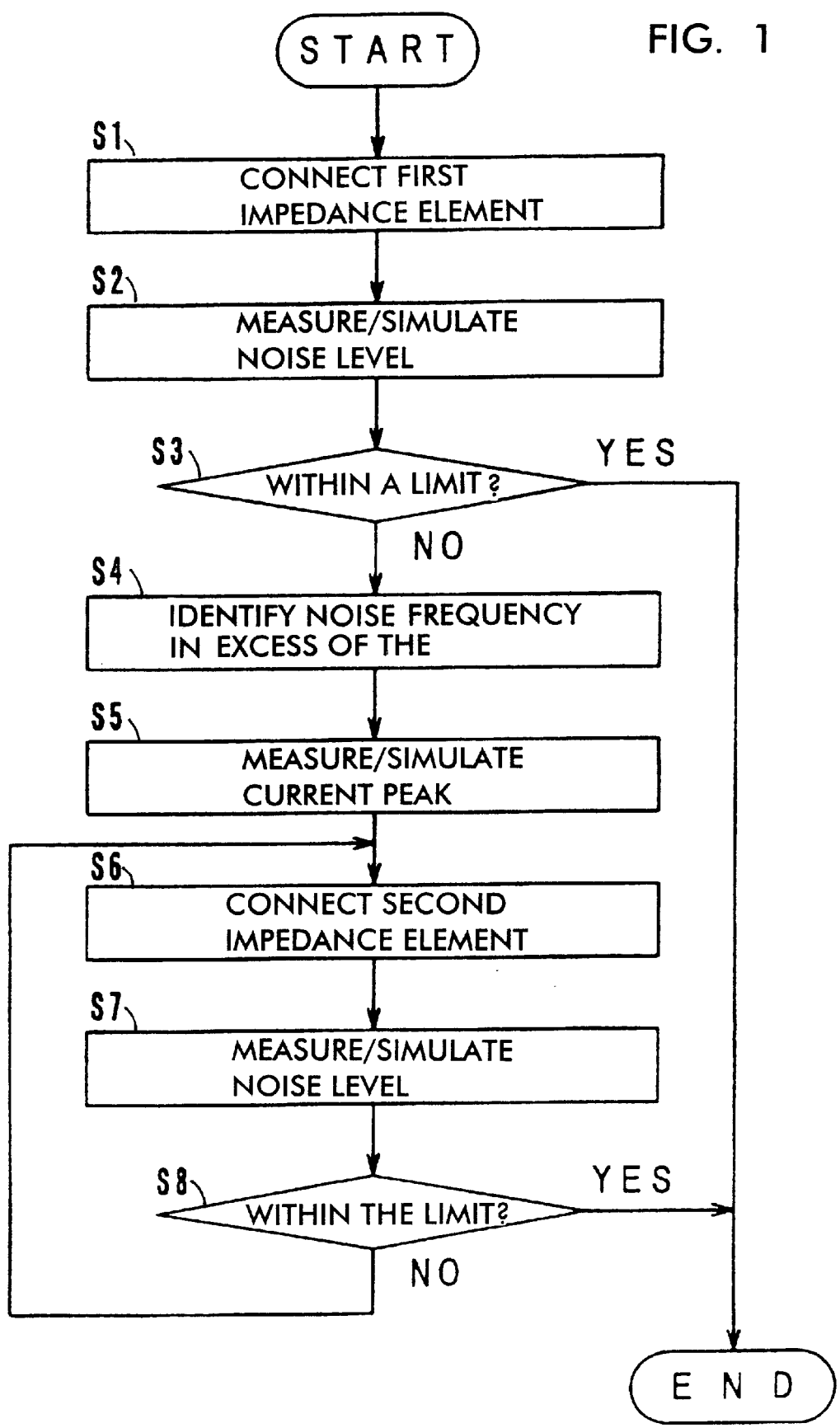
FIG. 1 is a flowchart which illustrates the noise reduction impedance element positioning procedure according to one embodiment of the present invention.

FIG. 1 is a flowchart which illustrates a noise reduction impedance element positioning method in accordance with one embodiment of the present invention.

Figure 2:
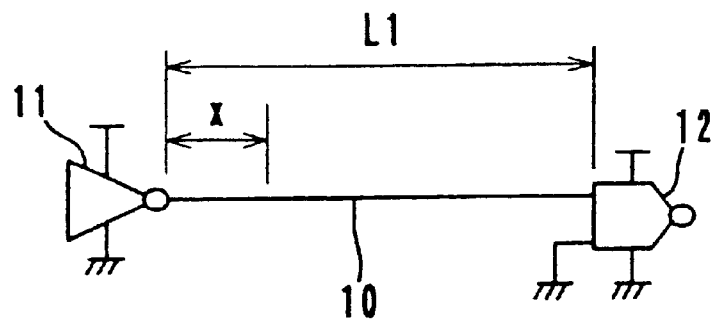
FIG. 2 is a schematic view of a transmission path in an initial state.

In accordance with this embodiment, as shown in FIG. 2, a digital signal circuit includes a transmission path 10 having both ends connected to a signal output IC 11 and a load IC 12, respectively. The transmission path 10 corresponds to a conductor pattern formed on a surface of a glass epoxy substrate and having a pattern width of 0.15 mm, a length L1 of 20 cm, and a characteristic impedance of 127 W.

Figure 3:
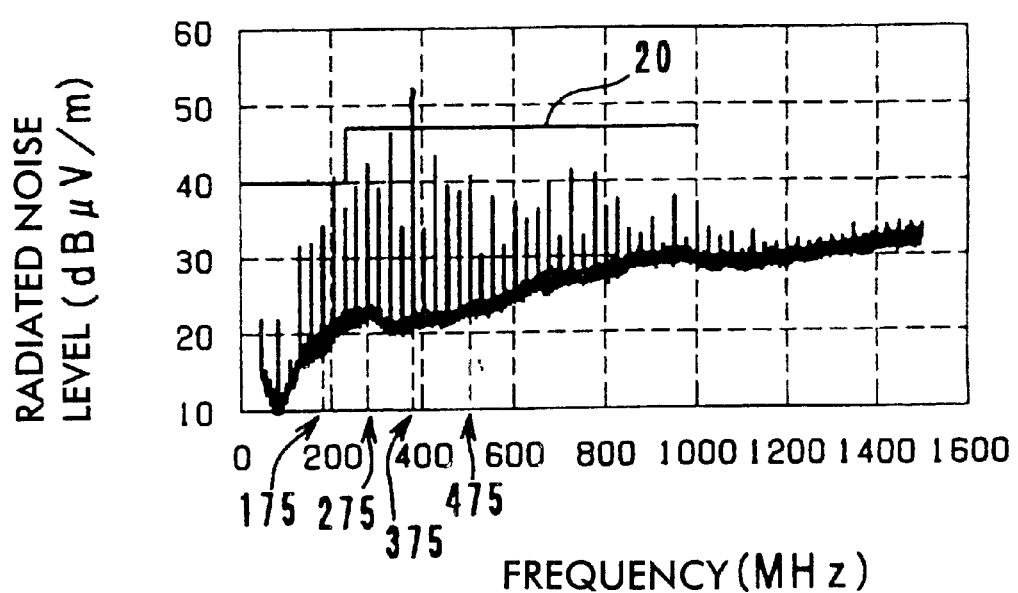
FIG. 3 is a graph showing the radiated noise characteristic of the transmission path shown in FIG. 2.

FIG. 3 is a graph showing the radiated noise characteristic of the transmission path 10 shown in FIG. 2, i.e., the transmission path 10 in an initial state where there is no noise reduction impedance element connected. In FIG. 3, a solid line 20 indicates a limit according to the CISPR (Comite International Special des Perturbations Radioelectriques) specification, which is an international noise standard.

Radiated noise which is to be reduced is a current signal. A noise current must be reduced in order to suppress the radiated noise.

Figure 4:
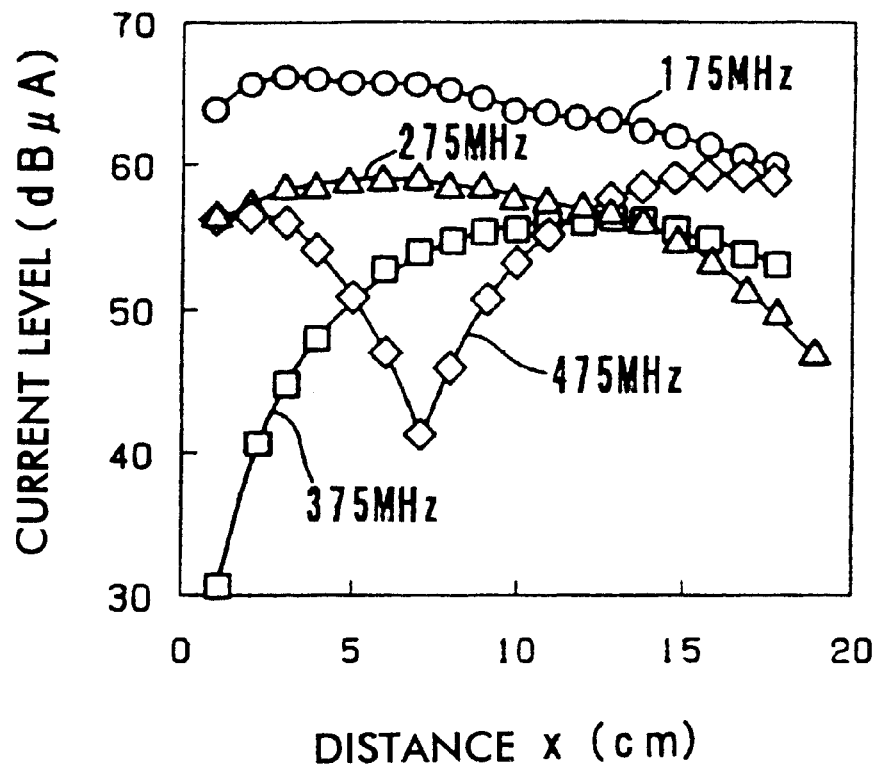
FIG. 4 is a current distribution chart when currents having various noise frequencies flow in the transmission path shown in FIG. 2.

FIG. 4 is a current distribution chart when currents having frequencies of 175 MHZ, 275 MHZ, 375 MHZ, and 475 MHZ flow in the transmission path 10 shown in FIG. 2. The current distribution chart shown in FIG. 4 is obtained by a measurement using a current probe when noise reduction impedance elements are positioned a distance x from the transmission end of the signal output IC 11, where x is variable.

Referring to FIG. 1, at step S1, a first noise-reduction impedance element 13 (see FIG. 5) is electrically connected to the transmission end of the signal output IC 11. In a typical digital signal circuit, since the current at the transmission end of the signal output IC 11 is greater, the first noise-reduction impedance element 13 which is connected to the transmission end of the signal output IC 11 allows radiated noise to be effectively reduced. Impedance elements used to reduce the noise current may include resistors, inductors, and common mode choke coils, but do not include capacitors. In the illustrated embodiment, a ferrite bead inductor is used as the first noise-reduction impedance element 13, and the ferrite bead inductor is positioned a distance of 1 cm from the transmission end of the signal output IC 11.

Figure 5:
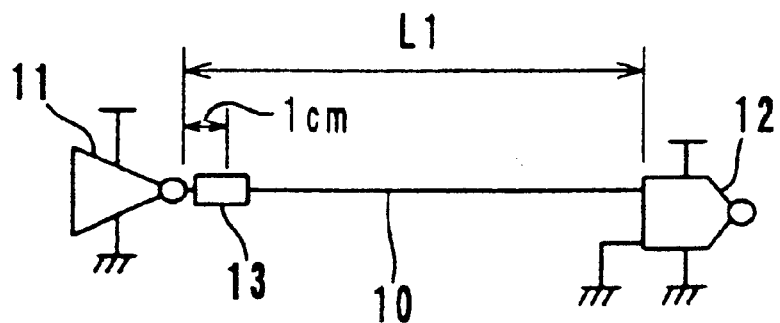
FIG. 5 is a schematic view of a transmission path to which a first noise-reduction impedance element is connected.
Figure 6:
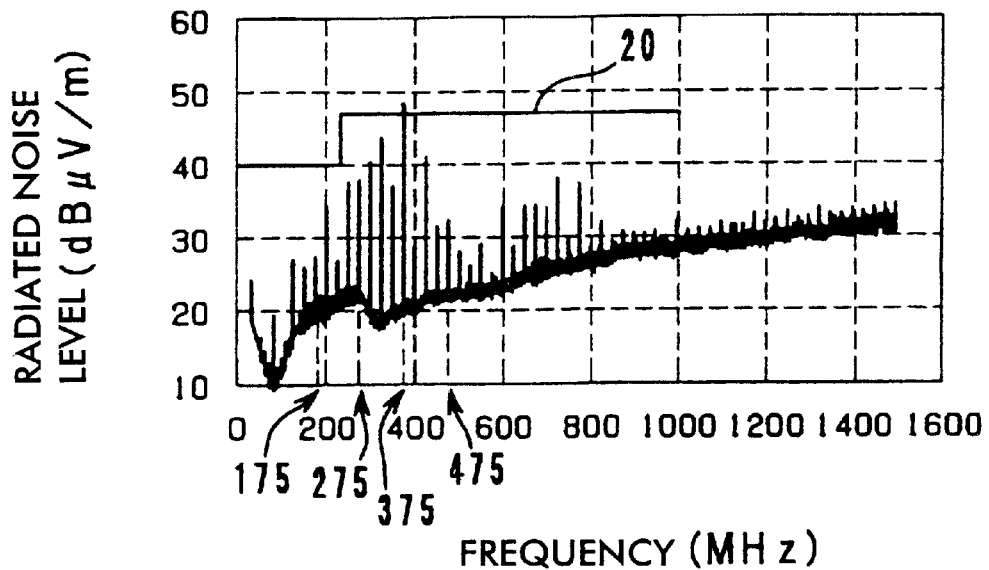
FIG. 6 is a graph showing the radiated noise characteristic of the transmission path shown in FIG. 5.

At step S2, the radiated noise characteristic of the transmission path 10 shown in FIG. 5, is found. The result is shown in FIG. 6.

At step S3, it is determined whether or not the resulting characteristic falls within a given limit according to the radiated noise specification. If it falls within the specified limit, noise reduction is sufficiently achieved by connecting the first noise-reduction impedance element 13. Then, the process ends.

On the other hand, if the resulting characteristic exceeds the specified limit, the radiated noise frequency that exceeds the specified limit is identified at step S4. Comparing the characteristics shown in FIGS. 3 and 6, it is clear that the radiated noise frequencies of 175 MHZ, 275 MHZ, and 475 MHZ are reduced by about 10 to 15 dB, and are within the limit according to the radiated noise specification. However, the radiated noise frequency of 375 MHZ is reduced only by 5 dB or less even if the first noise-reduction impedance element 13 is connected, and does not fall within the limit.

This is because, as shown in FIG. 4, the radiated noise frequencies of 175 MHZ, 275 MHZ, and 475 MHZ exhibit higher current distributions at the transmission end of the signal output IC 11, and can therefore be effectively reduced when the first noise-reduction impedance element 13 is connected to the transmission end of the signal output IC 11. On the other hand, the radiated noise frequency of 375 MHZ exhibits a lower current distribution at the transmission end of the signal output IC 11, and the current peak is located somewhere on the transmission path 10 (a distance of 12 cm from the transmission end of the signal output IC 11), and therefore cannot be effectively reduced when the first noise-reduction impedance element 13 is connected to the transmission end of the signal output IC 11. It is noted that the radiated noise frequency of 375 MHZ is not substantially reduced even if an inductor having higher impedance is used instead of the first noise-reduction impedance element 13.

At step S5, the current distribution is measured when a current having a frequency of 375 MHZ flows in the transmission path 10 to which the first noise-reduction impedance element 13 is connected. The result is indicated by a curve 20 in FIG. 7. For comparison, FIG. 7 also depicts a current distribution, indicated by a curve 21, when a current having a frequency of 375 MHZ flows in the transmission path 10 in an initial state where there is no noise reduction impedance element connected. From the curve 20, a position (x=12 cm) on the transmission path 10 corresponding to the current peak is determined when a current having a frequency of 375 MHZ flows.

At step S6, a second noise-reduction impedance element 14 (see FIG. 8) is electrically connected at the position (x=12 cm) corresponding to the current peak. Similarly to the first noise-reduction impedance element 13, the second noise-reduction impedance element 14 is implemented by an impedance element such as a resistor, an inductor, or a common mode choke coil, which does not include a capacitor. In the illustrated embodiment, the same type of inductor as that in the first noise-reduction impedance element 13 is used as the second noise-reduction impedance element 14.

At step S7, a radiated noise characteristic of the transmission path 10 shown in FIG. 8, i.e., the transmission path 10 to which the first and second noise-reduction impedance elements 13 and 14 are connected, is found. The result is shown in FIG. 9.

At step S8, it is determined again whether or not the resulting characteristic falls within a given limit according to the radiated noise specification. If it falls within the specified limit, noise reduction is achieved, and the process ends.

In the illustrated embodiment, as is apparent from FIG. 9, the radiated noise frequency of 375 MHZ is also sufficiently reduced by connecting the second noise-reduction impedance element 14, and is within the limit according to the radiated noise specification. The radiated noise frequency of 375 MHZ has a current peak located somewhere on the transmission path 10 (a distance of 12 cm from the transmission end of the signal output IC 11), as shown in FIG. 4. Therefore, by connecting the second noise-reduction impedance element 14 at that location, the radiated noise can be effectively suppressed.

FIG. 10 is a graph showing the relationship between the noise suppressing performance of the radiated noise frequency of 375 MHZ by the second noise-reduction impedance element 14 and the location at which it is connected. As is clear from FIG. 10, noise reduction can be most effectively achieved when the second noise-reduction impedance element 14 is connected at the location corresponding to the current peak of the frequency of 375 MHZ, i.e., a distance of 12 cm from the transmission end of the signal output IC 11. The current distribution has a profile as indicated by a curve 22 in FIG. 7 when the second noise-reduction impedance element 14 is connected at the location corresponding to the current peak of the frequency of 375 MHZ.

Referring again to FIG. 1, if the resulting noise characteristic exceeds the specified limit at step S7, the foregoing positioning steps are performed using another type of inductor, resistor, common mode choke coil, or the like instead of the second noise-reduction impedance element 14 (or the first noise-reduction impedance element 13).

Accordingly, impedance elements such as resistors, inductors, or common mode choke coils only, which do not include capacitors causing higher power consumption, are used to effectively achieve noise reduction.

FIG. 11 is a graph showing the radiated noise suppressing performance by the first and second noise-reduction impedance elements 13 and 14. This characteristic is indicated by a solid line 31. For comparison, in FIG. 11, a dotted line 32 indicates the radiated noise characteristic when only the first noise-reduction impedance element 13 is connected to the transmission path 10, as shown in FIG. 5. Furthermore, a dotted-chain line 33 indicates the radiated noise characteristic when the impedance of the first noise-reduction impedance element 13 increases.

FIG. 12 shows a floppy disk 100 which embodies a recording medium having a noise reduction impedance element positioning program recorded therein according to the present invention. Of course, the recording medium is not limited to the floppy disk 100, but may also be another medium such as a CD-ROM. A computer 120 transfers the noise reduction impedance element positioning program which is recorded in the floppy disk 100 to an internal CPU (central processing unit) for operation. Examples of the recorded program are now described in detail.

The floppy disk 100 contains data on the names of a plurality of impedance elements such as resistors, inductors, or common mode choke coils (not including capacitors), characteristic data on the radiated noise reduction performance of the impedance elements, a program implementing a process to determine the current distribution of a transmission path, and a program implementing the noise reduction impedance element positioning method as illustrated in the flowchart in FIG. 1 by simulation.

First, the name of a first noise-reduction impedance element, such as an inductor, a resistor, or a common mode choke coil, which is connected to the transmission end of a signal output IC of a transmission path at which noise reduction is desired is entered using an input device, including a keyboard and a mouse, of the computer 120 (corresponding to step S1 of the flowchart in FIG. 1). Then, the radiated noise characteristic of the transmission path to which the first noise-reduction impedance element is connected is determined by simulation using the input device, including the keyboard and the mouse (corresponding to step S2 of the flowchart in FIG. 1). The radiated noise characteristic may be retrieved from a measuring device connected directly or via a network to the computer 120. The characteristic may also be entered through a recording medium such as a floppy disk containing data from the measuring device.

The result of determination of whether or not the radiated noise characteristic falls within a permissible limit of the radiated noise characteristic which is prerecorded in the floppy disk is displayed on a display screen (corresponding to step S3 of the flowchart in FIG. 1). If the radiated noise characteristic exceeds the permissible limit, the noise frequency in excess of the limit is displayed on the display screen (corresponding to step S4 of the flowchart in FIG. 1).

The current distribution when a current having a noise frequency in excess of the limit flows in the transmission path to which the first noise-reduction impedance element is connected is determined by simulation using the input device, including the keyboard and the mouse, and the current peak is then found. The current peak may be retrieved from the measuring device connected directly or via a network to the computer 120 (corresponding to step S5 of the flowchart in FIG. 1).

Then, the name of a second noise-reduction impedance element which is connected at a location corresponding to the current peak is entered (corresponding to step S6 of the flowchart in FIG. 1). Next, the radiated noise characteristic of the transmission path to which the first and second noise-reduction impedance elements are connected is determined by simulation using the input device, including the keyboard and the mouse (corresponding to step S7 of the flowchart in FIG. 1).

The result of determination of whether or not the radiated noise characteristic falls within the permissible limit is displayed on the display screen (corresponding to step S8 of the flowchart in FIG. 1). If the radiated noise characteristic exceeds the permissible limit, the first or second noise-reduction impedance element is determined as being unsuitable. The name of another type of noise reduction impedance element is then entered using the input device of the computer 120. The characteristic data on the radiated noise reduction performance of the newly selected noise reduction impedance element is used to determine the radiated noise characteristic of the transmission path for a further determination. As a consequence, a reduced radiated-noise transmission path is realized.

Those skilled in art will understand that the present invention is not limited to the illustrated embodiment, and a variety of changes and modifications may be made without departing from the spirit and scope of the invention as defined by the following claims.

What is claimed is:

1. A noise reduction impedance element connection structure comprising:
    a transmission path for providing an electrical connection between a first electrical element and a second electrical element;
    a first noise-reduction impedance element electrically connected to the transmission path at a first location; and
    a second noise-reduction impedance element electrically connected to the transmission path at a second location; wherein
        said second location corresponds to the current peak of a noise frequency that exceeds a predetermined limit when said first noise-reduction impedance element is electrically connected to said transmission path; and
        said the first and second impedance elements are selected from a group of impedance elements which does not include capacitors.

2. A noise reduction impedance element connection structure according to claim 1, wherein the first electrical element is a signal output IC and the second electrical element is a load IC.

3. A noise reduction impedance element connection structure according to claim 2, wherein the first location is adjacent to the signal output IC.

4. A noise reduction impedance element connection structure according to claim 3, wherein the second location is adjacent to the load IC.

5. A noise reduction impedance element positioning method comprising the steps of:
    electrically connecting a first noise-reduction impedance element to a first location on a transmission path, the transmission path providing an electrical connection between a first electrical element and a second electrical element;
    determining whether or not a numerical value obtained by one of a measurement and a calculation using simulation with respect to a noise frequency satisfies a predetermined limit;
    identifying a noise frequency in excess of the predetermined limit;
    determining a location corresponding to a current peak of the noise frequency in excess of the predetermined limit by one of the measurement and the calculation using simulation; and
    electrically connecting a second noise-reduction impedance element at the location corresponding to the current peak.

6. A noise reduction impedance element positioning method according to claim 5, wherein the first electrical element is a signal output IC and the second electrical element is a load IC.

7. A noise reduction impedance element positioning method according to claim 5, wherein the first and second impedance elements are selected from a group of impedance elements which does not include capacitors.

8. A noise reduction impedance element positioning method according to claim 6, wherein the first location is adjacent to the signal output IC.

9. A noise reduction impedance element positioning method according to claim 8, wherein the second location is adjacent to the load IC.

10. A recording medium containing a program implementing a noise reduction impedance element positioning process by a computer, the process comprising the steps of:
    entering the name of a first noise-reduction impedance element and the name of a second noise-reduction impedance element, the first noise-reduction impedance element being electrically connected to a first location on a transmission path, the second noise-reduction impedance element being electrically connected to a second location on the transmission path, the transmission path providing an electrical connection between a first electrical element and a second electrical element;
    determining a location corresponding to a current peak of a noise frequency that exceeds a predetermined limit when the first noise-reduction impedance element is electrically connected to the transmission path;
    determining a noise characteristic of the transmission path to which the first and second noise-reduction impedance elements are connected, the second noise-reduction impedance element being connected at the location corresponding to the current peak; and
    determining whether or not the noise characteristic satisfies the predetermined limit.

11. A recording medium according to claim 10, wherein the first electrical element is a signal output IC and the second electrical element is a load IC.

12. A recording medium according to claim 10, wherein the first and second impedance elements are selected from a group of impedance elements which does not include capacitors.

13. A recording medium according to claim 11, wherein the first location is adjacent to the signal output IC.

14. A recording medium according to claim 13, wherein the second location is adjacent to the load IC.

* * * * *